United States Patent
McGrath et al.

(10) Patent No.: US 7,187,231 B2
(45) Date of Patent: Mar. 6, 2007

(54) APPARATUS, METHODS AND ARTICLES OF MANUFACTURE FOR MULTIBAND SIGNAL PROCESSING

(75) Inventors: Finbarr J. McGrath, Westford, MA (US); Eugene Heaney, Cork (IE); Pierce J. Nagle, Cork City (IE); Andrei V. Grebennikov, County Cork (IE)

(73) Assignees: M/A-COM, Inc., Lowell, MA (US); M/A-COM Eurotec, B.V., Cork (IE)

( * ) Notice: Subject to any disclaimer, the term of this patent is extended or adjusted under 35 U.S.C. 154(b) by 430 days.

(21) Appl. No.: 10/307,653

(22) Filed: Dec. 2, 2002

(65) Prior Publication Data

US 2004/0104768 A1   Jun. 3, 2004

(51) Int. Cl.
   *H03F 1/14* (2006.01)
(52) U.S. Cl. .................. 330/51; 330/126; 330/302; 330/310
(58) Field of Classification Search .................. 330/51, 330/126, 133, 302, 310
   See application file for complete search history.

(56) References Cited

U.S. PATENT DOCUMENTS

| | | | |
|---|---|---|---|
| 3,978,422 A | 8/1976 | Rheinfelder | |
| 4,580,111 A | 4/1986 | Swanson | 332/41 |
| 4,586,000 A | 4/1986 | Wagner | |
| 4,646,359 A | 2/1987 | Furrer | |
| 5,111,157 A * | 5/1992 | Komiak | 330/295 |
| 5,206,604 A * | 4/1993 | Vaninetti | 330/124 R |
| 5,278,997 A | 1/1994 | Martin | |
| 5,311,143 A | 5/1994 | Soliday | |
| 5,410,280 A | 4/1995 | Linguet et al. | |
| 5,642,002 A | 6/1997 | Mekanik et al. | |
| 5,659,267 A * | 8/1997 | Buer et al. | 330/295 |
| 5,774,017 A * | 6/1998 | Adar | 330/51 |
| 5,818,298 A | 10/1998 | Dent et al. | |
| 5,880,633 A | 3/1999 | Leizerovich et al. | |
| 5,892,431 A | 4/1999 | Osterman | |
| 5,930,128 A | 7/1999 | Dent | |
| 5,936,464 A * | 8/1999 | Grondahl | 330/136 |
| 5,939,951 A | 8/1999 | Bateman et al. | |
| 5,942,946 A | 8/1999 | Su et al. | |
| 5,952,895 A | 9/1999 | McCune, Jr. et al. | |
| 5,973,568 A * | 10/1999 | Shapiro et al. | 330/295 |
| 6,043,707 A | 3/2000 | Budnik | |
| 6,043,712 A | 3/2000 | Leizerovich et al. | |
| 6,069,525 A | 5/2000 | Sevic et al. | 330/51 |
| 6,075,413 A | 6/2000 | Katakura | |
| 6,078,628 A | 6/2000 | Griffith et al. | |
| 6,094,101 A | 7/2000 | Sander et al. | |

(Continued)

FOREIGN PATENT DOCUMENTS

WO   WO 01/10013 A1   2/2001

OTHER PUBLICATIONS

Patent Abstracts of Japan, Publication No. 2001156554, Publication Date Aug. 6, 2001, Application Date Oct. 10, 2000, Application No. 2000309898.

*Primary Examiner*—Khanh Van Nguyen

(57) ABSTRACT

Apparatus, methods and articles of manufacture for multiband transmitter power amplification are provided wherein one or more amplifying devices, of which at least one may be one or more current sources, have impedances matched for different input and output frequencies by way of various impedance matching circuits.

29 Claims, 8 Drawing Sheets

U.S. PATENT DOCUMENTS

| | | |
|---|---|---|
| 6,097,252 A | 8/2000 | Sigmon et al. |
| 6,101,224 A | 8/2000 | Lindoff et al. |
| 6,112,071 A | 8/2000 | McCune, Jr. |
| 6,127,887 A * | 10/2000 | Cho .................. 330/124 R |
| 6,133,788 A | 10/2000 | Dent |
| 6,140,875 A | 10/2000 | Van Den Homberg et al. |
| 6,140,882 A | 10/2000 | Sander |
| 6,147,553 A | 11/2000 | Kolanek |
| 6,157,258 A * | 12/2000 | Adishian et al. ............ 330/295 |
| 6,157,681 A | 12/2000 | Daniel et al. |
| 6,163,220 A * | 12/2000 | Schellenberg ............... 330/295 |
| 6,191,653 B1 | 2/2001 | Camp, Jr. et al. |
| 6,198,347 B1 | 3/2001 | Sander et al. |
| 6,201,452 B1 | 3/2001 | Dent et al. |
| 6,204,731 B1 * | 3/2001 | Jiang et al. .................. 330/310 |
| 6,215,355 B1 | 4/2001 | Meck et al. |
| 6,215,359 B1 * | 4/2001 | Peckham et al. ........... 330/302 |
| 6,219,394 B1 | 4/2001 | Sander |
| 6,236,284 B1 | 5/2001 | Duello et al. |
| 6,242,975 B1 | 6/2001 | Eidson et al. |
| 6,246,286 B1 | 6/2001 | Persson |
| 6,255,906 B1 | 7/2001 | Eidson et al. ........... 330/124 R |
| 6,259,901 B1 | 7/2001 | Shinomiya et al. |
| 6,269,135 B1 | 7/2001 | Sander |
| 6,285,251 B1 | 9/2001 | Dent et al. |
| 6,288,916 B1 | 9/2001 | Liu et al. |
| 6,294,957 B1 | 9/2001 | Luu |
| 6,297,694 B1 * | 10/2001 | Yamamoto .................... 330/51 |
| 6,298,244 B1 * | 10/2001 | Boesch et al. ................ 330/51 |
| 6,311,046 B1 | 10/2001 | Dent |
| 6,317,608 B1 | 11/2001 | Glöcker |
| 6,321,072 B1 | 11/2001 | Cipriani et al. |
| 6,323,731 B1 | 11/2001 | McCune, Jr. |
| 6,356,155 B1 | 3/2002 | Judkins |
| 6,366,177 B1 | 4/2002 | McCune et al. |
| 6,369,657 B2 | 4/2002 | Dening et al. |
| 6,377,784 B2 | 4/2002 | McCune |
| 6,380,802 B1 | 4/2002 | Pehike et al. |
| 6,404,823 B1 | 6/2002 | Grange et al. |
| 6,411,655 B1 | 6/2002 | Holden et al. |
| 6,426,677 B1 | 7/2002 | Prentice |
| 6,426,678 B1 | 7/2002 | Ko |
| 6,430,402 B1 | 8/2002 | Agahi-Kesheh |
| 6,445,247 B1 | 9/2002 | Walker |
| 6,449,465 B1 | 9/2002 | Gailus et al. |
| 6,552,634 B1 * | 4/2003 | Raab ........................ 330/302 |
| 6,624,700 B2 * | 9/2003 | Luo et al. .................... 330/281 |
| 6,674,323 B2 * | 1/2004 | Kagaya et al. ................ 330/51 |
| 6,765,439 B2 * | 7/2004 | Choi ........................ 330/129 |
| 6,865,399 B2 * | 3/2005 | Fujioka et al. ........... 455/553.1 |

* cited by examiner

APPARATUS, METHODS AND ARTICLES OF MANUFACTURE FOR MULTIBAND SIGNAL PROCESSING

FIELD OF THE INVENTION

The invention relates to power amplifiers, and more particularly to multiband power amplifiers.

BACKGROUND OF THE INVENTION

Power amplifiers used in transmitters may be optimized for use in a particular mode and frequency band to maximize efficiency. Such optimization may require the amplifier to be biased in a certain manner. Additionally, impedances usually need to be matched between components within the amplifier and between the amplifier and adjacent components.

Difficulties arise, however, with the demands some communication systems place upon an amplifier. For example, in a W-CDMA or CDMA2000 transmitter, a signal with a non-constant envelope is traditionally fed through a power amplifier. However, it is difficult to reach optimum levels of amplifier efficiency and linearity: design compromises between the two are often required. Moreover, a wide range of output power is required: typically on the order of 80 dB.

Further difficulties may arise with multiband transmitters. For example, impedance is dependant on the operating frequency, and therefore, an amplifier having optimal impedance matching in one frequency band will not be optimized for operation in a different frequency band. Problems related to impedance matching at different frequencies may be solved by providing separate amplifying chains. Separate amplifying chains, however, can be costly, increase the size of the transmitter and increase the power required for the transmitter.

Amplifier design and impedance matching is further made difficult because, in present communication systems, it is desirable for an amplifier to operate over multiple frequency bands. For example, a transmitter may be used in GSM900 (880–915 MHz) and DCS1800 (1710–1785 MHz bands). As another example, a transmitter may be used in CDMA800 (824–849 MHz) and CDMA1900 (1850–1910 MHz) frequency bands. Typically, dual-band mobile phone transceivers contain two power amplifiers, each operating within a single frequency bandwidth, and each requiring impedance matching.

The prior art has attempted to provide solutions to amplifier design and impedance matching difficulties. For example, FIG. 1 shows one prior art attempt at impedance matching for a dual-band single-stage power amplifier operating in either the 800 MHz or the 1900 MHz bands. A single active device with switching impedance networks 104 and 106 at the input, amplifier 102, bias control 103, voltage source 107 switching impedance network 105 and switching impedance networks 108 and 110 at the output, to provide desired input and output impedances. The need for these switching impedance networks, however, drives up the cost of the device and drives down the efficiency.

Another approach to impedance matching in a dual-band power amplifier is shown in FIG. 2. Amplifier 214 is matched to a first matching circuit 202. A second matching circuit 204 consisting of two separate impedance networks 206 and 208 is tuned to each frequency bandwidth. Two switches 210 and 212 are necessary to this approach. This approach again drives up the cost of the device as well as driving down efficiency.

Another prior art approach is to ignore efficiency considerations. For example, low-efficiency Class A operation matching circuits for multiband, single-stage power amplifiers may be used. These are based on field-effect transistors (FETs). In these circuits, the difference between power gain for 800 MHz and 1900 MHz is very significant, typically about 15 dB. However, if a consistent output power is desired, such as in 2.5 G and 3 G communication systems, different input power needs to be applied to the different amplifiers, which may create further design difficulties.

Yet another prior art approach is to provide multistage power amplifiers. Multistage power amplifiers may be generally desirable as they may provide increased input resistance, increased gain and increased power handling capability, when compared to single stage power amplifiers. However, implementations to date, such as shown in multi stage embodiments of the device seen in FIG. 1, have power drain as well as device cost difficulties. For example, the prior art embodiment shown in FIG. 1 may be utilized in a multistage power amplifier. However, the number of components such as impedance networks and switches is increased in this type of approach, thus increasing cost, size and inefficiency of the system.

Accordingly, there is a need for a low cost, high efficiency multiband amplifier capable of providing appropriate output power across multiple frequency bands.

SUMMARY OF THE INVENTION

Apparatus, methods and articles of manufacture for multiband transmitter power amplification are provided. In preferred embodiments, at least one amplifying device is provided, with an input impedance matching circuit to compensate for differing input and output signal frequencies. In other embodiments, a plurality of amplifying devices may be provided with input impedance matching circuits as well as interstage impedance matching circuits and output matching circuits.

DETAILED DESCRIPTION OF THE PREFERRED EMBODIMENTS

Figure 1:
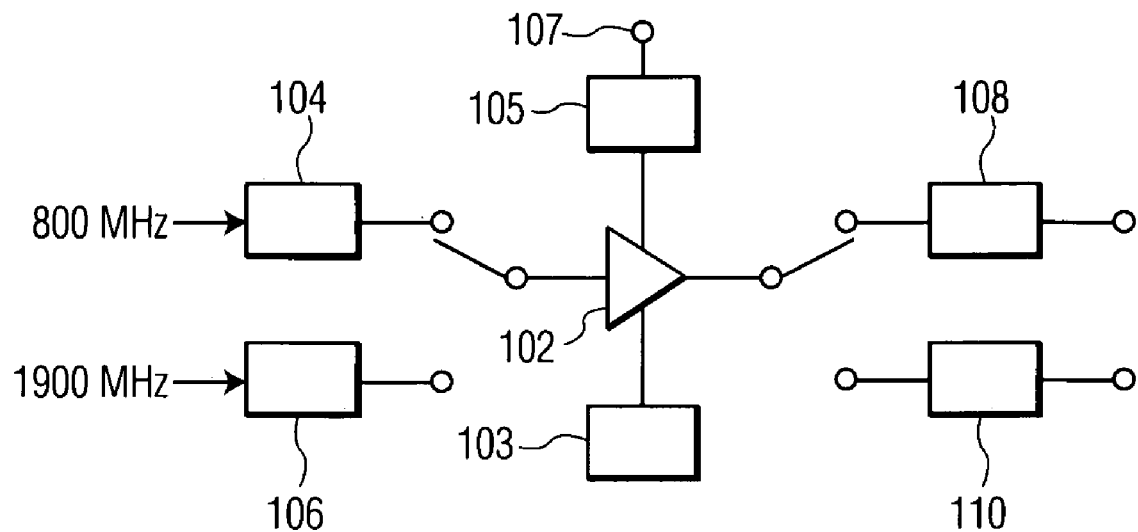
FIG. 1 depicts a prior art dual-band device.
Figure 2:
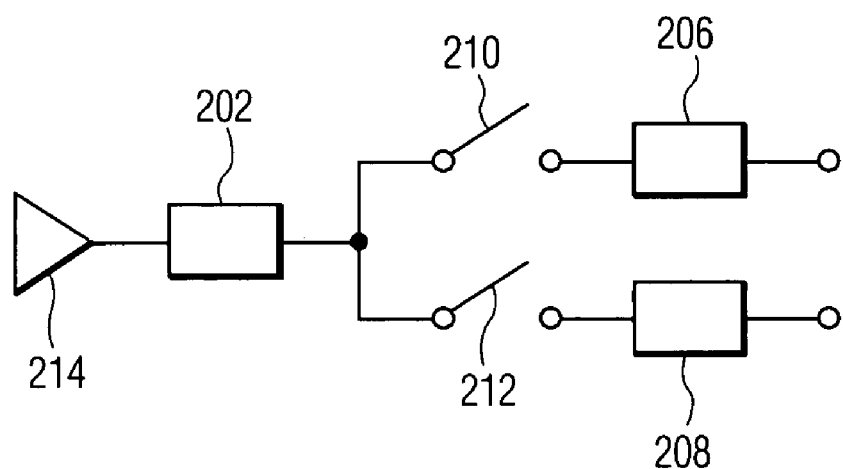
FIG. 2 depicts a prior art dual-band device.
Figure 3:
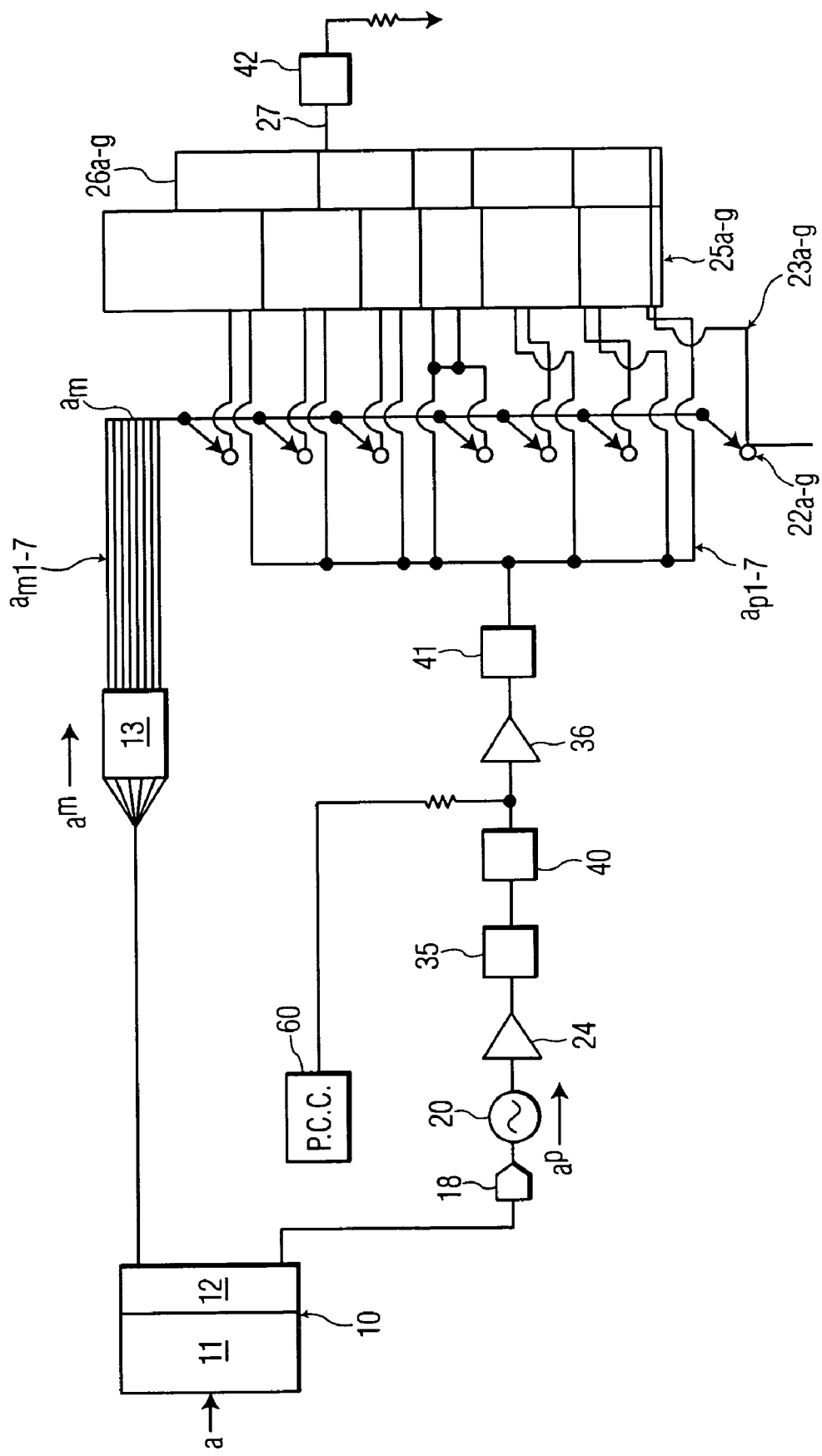
FIG. 3 shows a preferred embodiment.

The present invention comprises apparatus, methods and articles of manufacture for multiband transmitter power amplification are provided. FIG. 3 shows a preferred embodiment. Digital Signal Processor 10 comprises an Analog to Digital Converter 11, which digitizes a multiband input signal by the use of rectangular coordinates or I,Q data.

Rectangular to Polar Converter 12 then receives the I,Q data and translates it into polar coordinates. For example, a signal may take the form R, P(sin) and P(cos), where the R coordinate represents the amplitude characteristic of the signal and the P(sin) and P(cos) coordinates represent the phase characteristic of the signal.

The amplitude characteristics of the input signal are converted, via converter 13, along path $a^m$, into digital pulses comprising a digital word quantized into bits $B_0$ to $B_{n-1}$, with a Most Significant Bit ("MSB") to Least Significant Bit ("LSB"). The digital word may be of varying lengths in various embodiments. In general, the longer the word the greater the accuracy of reproduction of the input signal. The digital word provides instruction signals or controls for attenuation and/or amplification, in manner to be described further below. Of course, as is described further below, in other embodiments, a differently composed digital word may be used, as well as other types of derivation and/or provision of amplitude or other signal characteristics.

In the embodiment of FIG. 3, seven control component lines $a^m1$–$a^m7$ are shown leading away from the converter 13. The number of these control component lines depends, in the preferred embodiments, upon the resolution of the word. In this preferred embodiment, the word has a seven bit resolution. For ease of viewing FIG. 3, the control component lines are consolidated into a single path $a^m$ leading into control components 22a–g. However, in the embodiment, and as further described below, the control component lines are not consolidated and instead feed into the control components individually. For example a component (not shown) may also be used, if desired, to feed any desired corrections to the amplitude characteristic through the converter 13, e.g. a look up table, etc.

The phase characteristic travels along path $a^p$. Here the phase characteristic is first modulated onto a wave by way of Digital to Analog Converter 18 and Synthesizer 20 (which is a Voltage Controlled Oscillator in an especially preferred embodiment.) Synthesizer 20 provides an output wave, which is comprised of the phase information. This output wave has a constant envelope, i.e., it has no amplitude variations, yet it has phase characteristics of the original input wave, and passes to driver 24, and in turn driver lines $a^p1$–$a^p7$.

A time delay compensation circuit 35 provides synchronization capabilities for the phase and amplitude characteristics. An input impedance matching circuit 40 matches impedance for the phase characteristic with the first amplifying device 36. Preferred embodiments of input impedance matching circuit 40 are further described below. Any input impedance matching circuit of the preferred embodiments should match impedances to compensate for the potentially changing dynamic range (possibly in the range of 80 dB) and concomitant variation in the signal provided to an amplifying device.

The output from amplifying device 36, which, it will be recalled, is a phase modulated component of the original input signal, is then fed to interstage impedance matching circuit 41. Preferred embodiments of interstage impedance matching circuit 41 are further described below, and match impedance from the varying output signal of amplifying device 36 into non-linear current sources 25a–g. Once the signal has been processed through non-linear current sources 25a–g, as will be described in further detail below, it is combined into line 27, and passes into output impedance matching circuit 42. Preferred embodiments of output impedance matching circuit 42 are further described below.

Returning now to the embodiment of FIG. 3, output impedance matching circuit 42 will match impedance between the output of through non-linear current sources 25a–g and any load. A band diplexer may be interposed here if the load is an antenna, so as to provide output among the various frequency bands.

Returning now to the processing of the signal into through non-linear current sources 25a–g, the phase component, it will be recalled, has been output from interstage impedance matching circuit 41. The signal is then split among driver lines $a^p1$–$a^p7$ and is fed into non-linear current sources 25a–25g, and will serve to potentially drive non-linear current sources 25a–25g.

In the present embodiment, transistors may be used as non-linear sources current 25a–25g. Additionally, in other embodiments, one or more transistors segmented appropriately may be used as non-linear current sources 25a–25g.

Path $a^m$ (comprised of control component lines $a^m1$–$a^m7$ as described above) terminates in control components 22a–g. In the especially preferred embodiment, these are switching transistors, and are preferably current sources. Control components 22a–g are switched by bits of the digital word output from the amplitude component and so regulated by the digital word output from the amplitude component. If a bit is "1" or "high," the corresponding control component is switched on, and so current flows from that control component to an appropriate non-linear current source 25a–g along bias control lines 23a–g. As had been noted above, the length of the digital word may vary, and so the number of bits, control components, control component lines, driver lines, bias control lines, current sources, etc. may vary accordingly in various embodiments. Moreover, a one to one correspondence among digital word resolution, components, lines and current sources is not required in various embodiments.

Non-linear current sources 25a–g receive current from a control component if the control component is on, and thus each current source is regulated according to that component. In the especially preferred embodiments an appropriate control component provides bias current to the current sources, as is described further below, and so the control component may be referred to as a bias control circuit, and a number of them as a bias network. In some embodiments, it may be desired to statically or dynamically allocate one or more bias control circuits to one or more current sources using a switching network if desired.

Each current source serves as a potential current source, and is capable of generating a current, which is output to current source lines 26a–g respectively. Each current source may or may not act as a current source, and so may or may not generate a current, because it is regulated via the appropriate instruction signal, or digital word value regulating a control component. Activation of any segment, and generation of current from that segment, is dependant upon the value of the appropriate bit from the digital representation of the amplitude component regulating the appropriate control component. The non-linear current sources are not an amplifying device or amplifying devices, in the preferred embodiments, rather the plurality of non-linear current sources function as an amplifying device, as is described herein. Indeed, amplification and/or attenuation may be considered in the preferred embodiments as functions of those embodiments, and so may an amplifying device and/or attenuating device be considered to be an electrical component or system that amplifies and/or attenuates.

Figure 4:
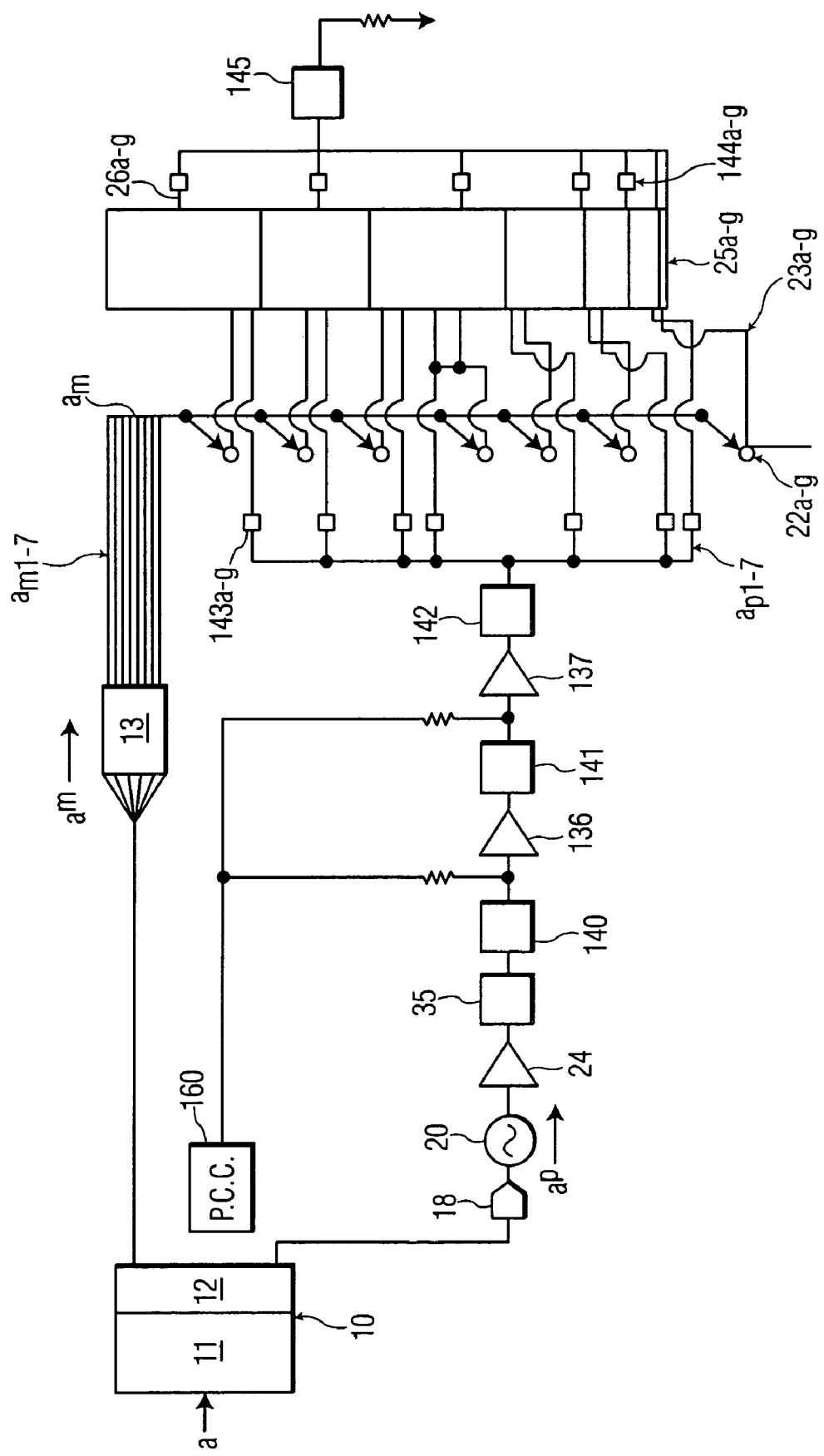
FIG. 4 shows a preferred embodiment.

FIG. 4 shows another preferred embodiment. Here the signal is translated into amplitude and phase components as had been described above with regard to FIG. 3. Identically numbered components are as set forth in FIG. 3. An input impedance matching circuit 140 matches impedance for the phase characteristic with the first amplifying device 136. Here the first amplifying device 136 is desirably constructed so as to have an amplification area as a fractional value of the amplification area of through non-linear current sources 25a–g. First interstage matching circuit 141 provides impedance matching between first amplifying device and second amplifying device 137. Second amplifying device 137 is desirably constructed so as to have an amplification area as a fractional value of the amplification area of through non-linear current sources 25a–g, which may be greater than first amplifying device 136. Second interstage matching circuit 142 provides impedance matching between second amplifying device 137 and through non-linear current sources 25a–g. Second interstage matching circuit 142 only provides one half of the desired matching at this stage. The second half is provided by interstage matching circuits 143a–g disposed on the driver lines $a^p1$–$a^p7$ respectively. These circuits are desirably high pass or low pass filters.

After the signal is amplified or attenuated, output impedance matching circuits 144a–g provide impedance matching on each of current source lines 26a–g respectively. In other embodiments, output matching circuits such as 144a–g may be not be implemented. Output impedance matching circuit 145 then provides matching to any load, e.g. a diplexer and antenna. Preferred embodiments of output impedance matching circuit 145 are further described below.

As individual transistors in the array are turned on or off, the output impedance matching circuits 144a–g provide a switching impedance matching array to increase the efficiency of the array. For example, for 1 W output power and 3 V supply voltage the maximum efficiency will be realized with all transistors switched on at a load resistance equal to transistor output resistance of $(3V)^2/(2*1W)$=4.5 Ohm. If, however, only transistor 22g with an output power of 7.8 mW is on, the load impedance equals to $(3V)^2/(2*7.8 mW)$=577 Ohm. Thus, if a single output impedance matching circuit such as 145 is used in an embodiment, it must match a maximum transistor output resistance of 577 Ohm (where load resistance is 50 Ohm.) Thus, as is described further below, it may be desired to use a switching output impedance matching circuit in this and other embodiments.

Figure 5:
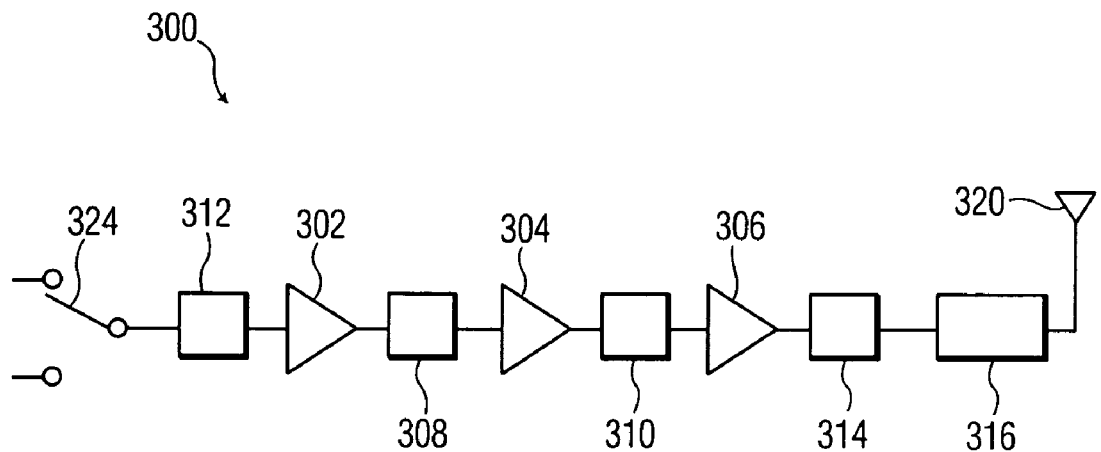
FIG. 5 shows a preferred embodiment.

FIG. 5 shows another preferred embodiment. Signals of frequency $f_1$ and/or $f_2$ are input to switch 324. Switch 324, which in this embodiments is a high speed transistor, switches between the input signals to be amplified. A control circuit (not shown) may be used to determine the operating bandwidth. The device 300 functions as a multistage power amplifier, with a plurality of amplifying devices 302, 304 and 306 separated by interstage impedance matching circuits 308 and 310. The amplifying devices are preferably transistors. An input impedance matching circuit 312 matches impedance between the first amplifying device 302 and the input signal. An output impedance matching circuit 314 matches impedance between the last amplifying device 306 and any load. A band diplexer may be interposed here if the load is an antenna, so as to provide output among the various frequency bands. It should be noted as well that in this or other preferred embodiments, it may be desired as well to simultaneously match impedances at different frequencies.

Switch 324 is, in this preferred embodiment, a high speed switch or band diplexer. Switch 324 will, depending upon the frequency band, transfer the signal into impedance matching circuit 312. It should be noted that a switch is present in this embodiments in order to minimize impedance effect on the signal from the remainder of the embodiment. That is, without a switched path, "downstream" impedance on an incoming signal might affect the signal's integrity and system performance. However, other embodiments may utilize other or no input switches.

Interstage impedance matching circuit 308 matches the impedance between amplifying devices 302 and 304 for the different frequencies. Amplifying device 304 is, in the preferred embodiments, similar to amplifying device 302. Similarly, interstage impedance matching circuit 310 and amplifying device 306 are, in the preferred embodiments, similar to interstage impedance matching circuit 308 and amplifying device 304 respectively. Of course, the values for impedance, capacitance and resistance may be different among the components.

Some loss is acceptable through the various stages of the embodiment of FIG. 5, and indeed in all the preferred embodiments. That is, less than optimum impedance matching may occur for dual band frequencies through input impedance matching circuit 312, amplifying devices 302, 304 and 306 and interstage impedance matching circuits 308 and 310. Any such loss is compensated for by the multiple amplifying devices of this embodiment. In other embodiments, which may contain more or fewer stages, certain of those stages may have alternate impedance matching devices as is known in the art. For example, in an alternate three stage power amplifier embodiment, a middle stage may be provided with a second impedance matching circuit, as for example, an circuit similar to the output matching impedance circuit of the embodiments of FIGS. 7–10.

The embodiments of FIGS. 3 through 5 may be implemented on a semiconductor device where desired, such as an integrated circuit (IC) or an application-specific integrated circuit (ASIC) composition; some examples include silicon (Si), silicon germanium (SiGe) or gallium arsenide (GaAs) substrates. The output impedance matching circuit 145 of FIG. 4 may be, however, depending upon its construction, as is described further below with regard to various embodiments, implemented separately from an IC or ASIC.

Figure 6:
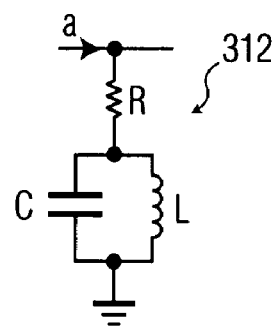
FIG. 6 shows a preferred embodiment.

Turning to FIG. 6, a preferred embodiment of an input impedance matching circuit is shown. In the preferred embodiments, this circuit is also used as an interstage impedance matching circuit. The circuit comprises a series RLC circuit, which accepts input in the direction a. This circuit is especially suited for broadband operation (as are the generally preferred embodiments.) Of course, in other embodiments, other circuits may be used, such as a low pass or high pass ladder filter.

Figure 7:
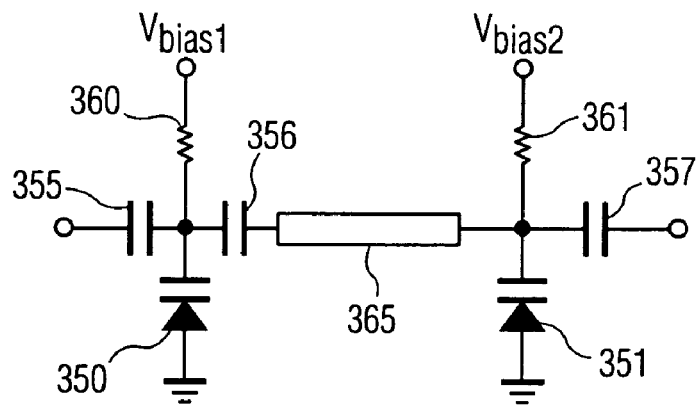
FIG. 7 shows a preferred embodiment.

FIG. 7 shows a switching output impedance matching circuit embodiment, which may provide greater efficiency. For example, although a single ON transistor in array 25a–g of FIG. 3 or 4 may match a 50 Ohm load, two ON transistors, because they are connected in parallel, will halve the overall output impedance (50 Ohm/2=25 Ohm.) Thus a different output impedance matching condition is required. Similarly N transistors will have an overall output impedance, assuming a 50 Ohm load, of 50/N, and so switching output impedance matched circuit should have an impedance matching capability of X/N, where X equals the desired output impedance and N equals the number of transistors in an array. The bias voltages $V_{bias1}$ and $V_{bias2}$ provide the capacitance values to varactors 350 and 351. Capacitors 355, 356 and 357 are DC blocking capacitors; resistors 360 and 361 are desirably large to prevent RF leakage. Transmission line 365 is a less than quarter wave line providing inductive impedance. Due to these additional components, and use of the embodiment in a non linear current source embodiment as was described in FIG. 3 or 4 above, the components may need to be calibrated preliminarily, which may be done using switches or p-i-n diodes for maximum efficiency.

Figure 8:
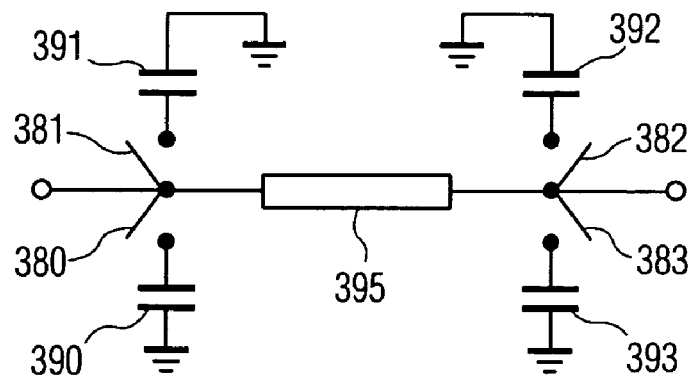
FIG. 8 shows a preferred embodiment.

FIG. 8 shows another switching output impedance matching circuit embodiment, which may provide greater efficiency. Here, four single switches 380–383 and four capacitors 390–393 match the impedances. Transmission line 395 is a less than quarter wave line providing inductive impedance. Note that the number of inputs in this and other embodiments may determine the components composition. For example, if this embodiment is utilized within an embodiment having seven transistors (such as was described above with regard to FIG. 3) it may be desired to use fewer components, e.g. three capacitors, as they will provide the requisite matching for the seven possible outputs (i.e. where 50/N=50/1, 50/2... 50/7.) Capacitors 390–393 are matching capacitors. Due to these additional components, and use of the embodiment in a non linear embodiment as was described above in FIG. 3 or 4, the components may need to be calibrated preliminarily, which may be done using switches or p-i-n diodes for maximum efficiency.

It should be noted that it is not necessary to provide maximum efficiency across the output, and thus match impedances exactly in the preferred embodiments, insofar as the transistors in the array of the preferred embodiments are used as current sources, rather than voltage sources.

Figure 9:
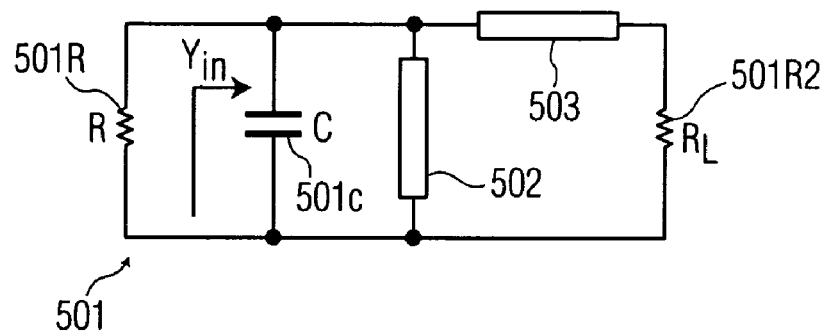
FIG. 9 shows a preferred embodiment.

Turning now to FIG. 9, another embodiment of an output impedance matching circuit is shown. In the especially preferred embodiments for broadband transmission, such as might be seen in the embodiments of FIGS. 3 to 5, output impedance matching in this stage uses a parallel-circuit load network. The parallel circuit load network is tuned to specific values for impedance, capacitance and resistance, according to the appropriate values of the remainder of the embodiment. The load network consists of resonant circuit 501, which includes capacitor 501C, resistor 501R (with resistance R) and load 501R2 (with resistance $R_L$), parallel short circuited transmission line 502, and quarter wave transmission line 503. Parallel short-circuited transmission line 502 and parallel capacitance 501c provide inductive impedance at a central frequency of $f_0=\sqrt{f_1 f_2}$, where $f1$ is the low bandwidth frequency and $\theta 2$ is the high band width frequency.

The inductive impedance of the load network may differ with different frequencies, of course. Generally, it is determined by:

$$Z_{net1}=R/(1-j \tan 34.244°)$$

where R is the required output resistance and $R_L=Z_{01}^2/R$. Any impedances at the higher-order harmonics should be capacitive.

In the especially preferred embodiments, optimum load network parameters may be defined by $$\tan\theta = 0.732\frac{R}{Z_0} \quad C = \frac{0.685}{\omega R} \quad R = 1.365\frac{V_{cc}^2}{P_{out}}$$

where $V_{cc}$ is the supply voltage, $P_{out}$ is the output power, and $Z_0$ and $\theta$ are characteristic impedance and electrical length of the parallel short circuited transmission line 502, respectively.

The capacitance C is the internal device capacitance, (although some external output capacitance may be present as well, and should be factored accordingly) which is chosen as is known in the art for the appropriate frequencies. For example, if output impedance matching circuit is a bipolar device, collector capacitance will be utilized. As another example, if output impedance matching circuit is an FET transistor, then drain capacitance will be utilized.

Quarter-wave transmission line 503 will have impedance $Z_{01}$ and electrical length of $\theta 1=90.°$ Quarter-wave transmission line 503 can be considered as a high-frequency series resonant circuit and so effectively widen the overall frequency range. In other embodiments, of course, other methods as known in the art may be used as well, or none at all.

Figure 10:
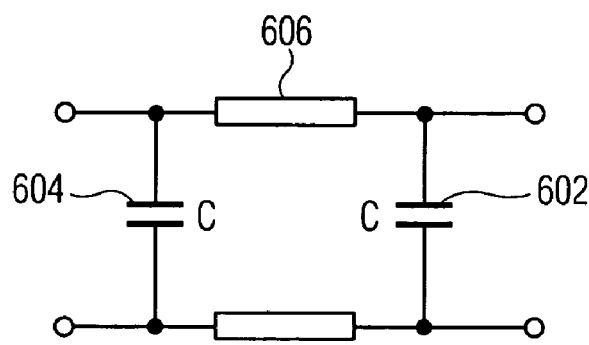
FIG. 10 shows a preferred embodiment.

An alternative embodiment is shown in FIG. 10. Here two capacitors 602 and 604 and a shorter transmission line 606 are substituted for the quarter wave transmission line 503 of FIG. 9. The parameters of the components are defined by $$Z_{02} = \frac{Z_{01}}{\sin\theta_2} \quad C = \frac{\cos\theta_2}{\omega Z_{01}}$$

Figure 11:
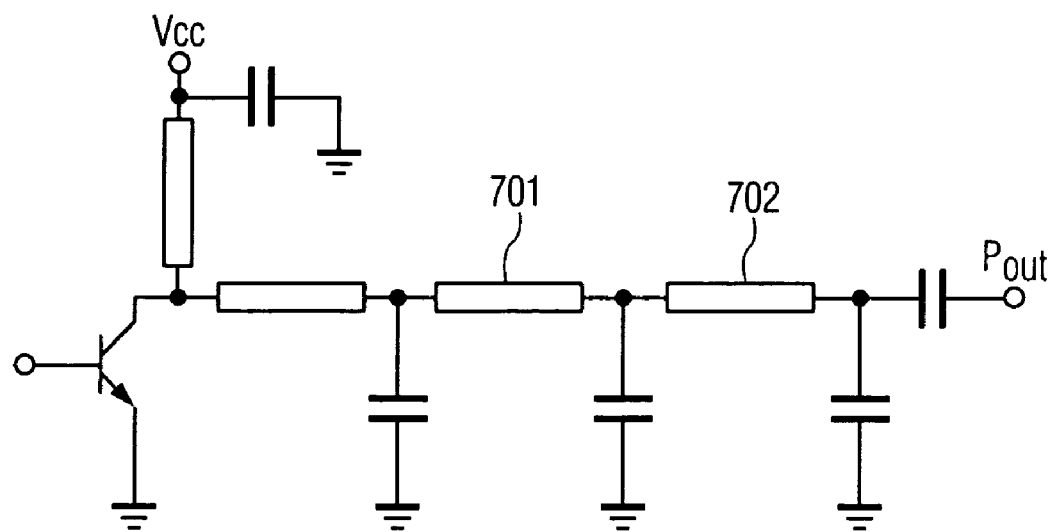
FIG. 11 shows a preferred embodiment.

Another alternative embodiment is seen in FIG. 11. This embodiment is preferably used in broadband embodiments when output impedances are small, on the order of about 5 Ohm. Two L-section transformers 701 and 702 with series transmission lines and parallel capacitances are added to an embodiment such as seen in FIG. 11.

Of course, other embodiments may use other output impedance matching circuits, e.g. a low pass ladder filter.

Figure 12:
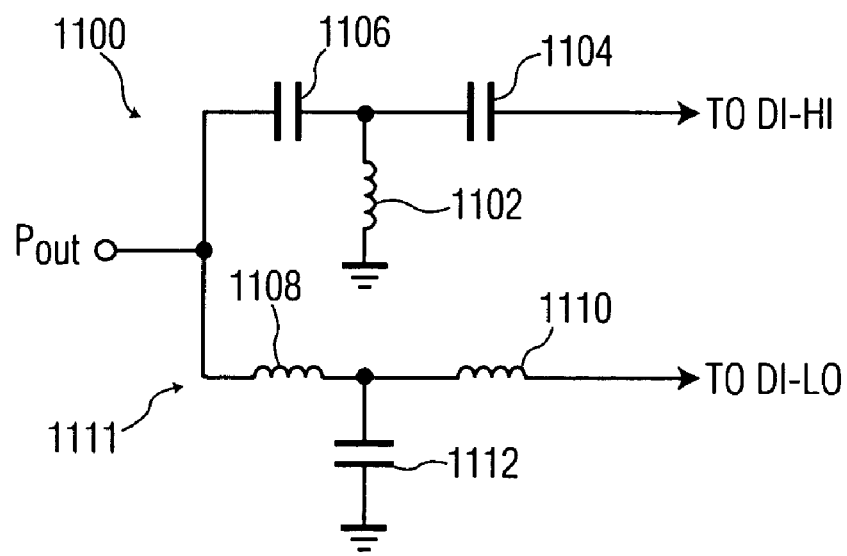
FIG. 12 shows a preferred embodiment.

A preferred embodiment of a band diplexer comprised of high-pass and low-pass filters is shown in FIG. 12. Such an embodiment minimizes any insertion loss in a switched embodiment, such as that shown in FIG. 5. High pass filter 1100 comprises inductor 1102 and capacitors 1104 and 1106. Low pass filter 1111 comprises inductors 1108 and 1110 and capacitor 1112. In yet other embodiments, the inductors may be replaced by a short transmission line with high characteristic impedance and the capacitors may be replaced by an open-circuit stub.

Figure 13:
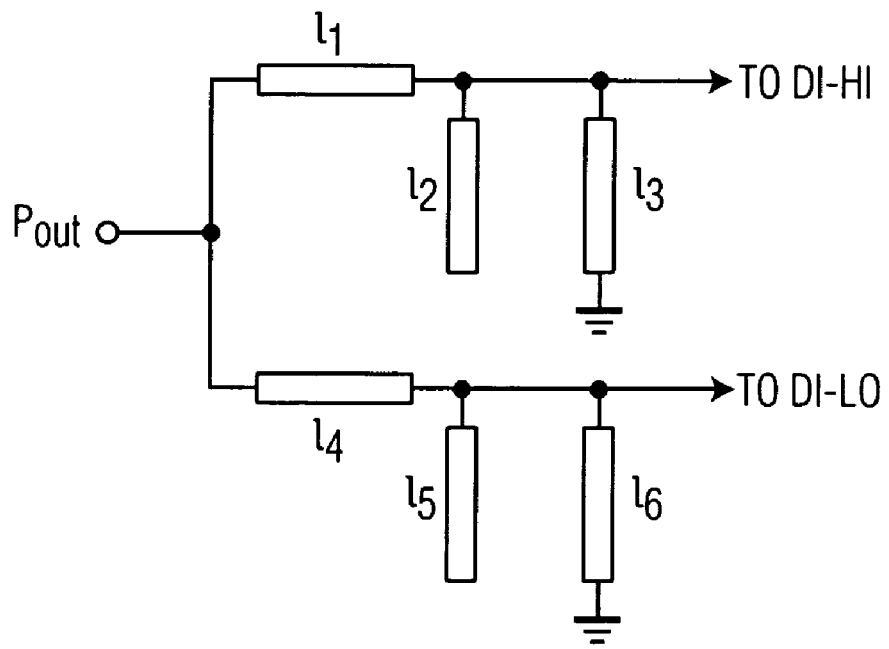
FIG. 13 shows a preferred embodiment.

Alternatively, in yet another embodiment a band diplexer may be formed with quarter-wave or half-wave transmission lines as shown in FIG. 13. In this embodiment, the transmission line lengths $l_1$ and $l_2$ are quarter-wave at 800 MHz to protect the higher frequency path from the lower frequency signal whereas lengths $l_4$ and $l_5$ are quarter-wave at 1900 MHz to protect the lower frequency path from the higher frequency signal. To reduce or eliminate any additional required matching, length $l_3$ is chosen to realize the parallel equivalent circuit with an open-circuit stub, i.e. the overall length $l_2+l_3$ should be half-wave at 1900 MHz as well as the overall length $l_5+l_6$ should be half-wave at 800 MHz. The series transmission lines preferably have 50-Ohm characteristic impedances.

As yet another embodiment, one or more notch filters may be used within an output impedance matching circuit or band diplexer, thus further attenuating any undesirable frequencies. For example, suppression of the second harmonic at the 840 MHz bandwidth, (1.68 GHz) is desirable in a CDMA800/CDMA1900 embodiment. This harmonic will be within the power amplifier frequency bandwidth and so should be attenuated. Therefore, a notch filter may be used.

Figure 14:
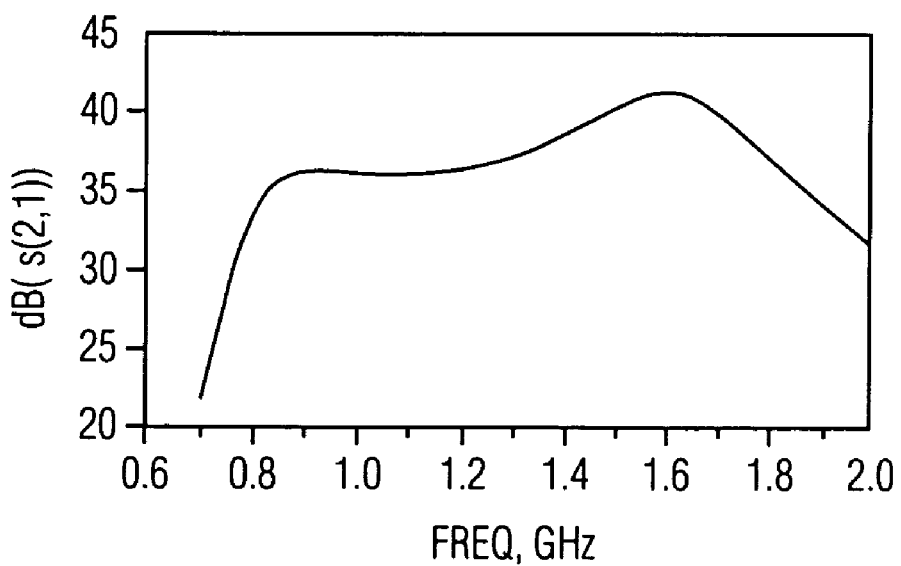
FIG. 14 shows performance of a preferred embodiment.

FIG. 14 shows performance of a multiband, multistage power amplifier device embodiment for small parameter signal S(2,1). A frequency range of 820 to 1910 MHz shows a power gain deviation of approximately 7 dB for this specific frequency.

Figure 15:
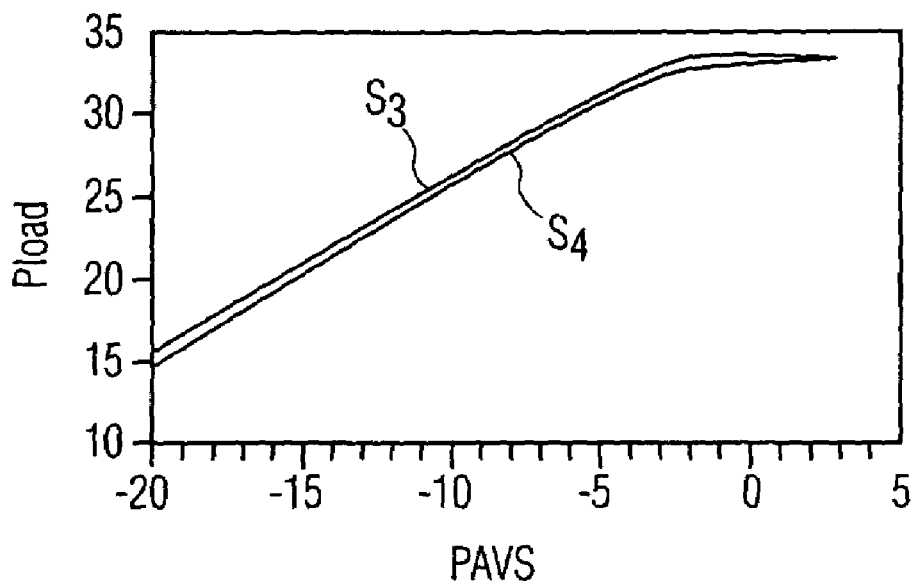
FIG. 15 shows performance of a preferred embodiment.
Figure 16:
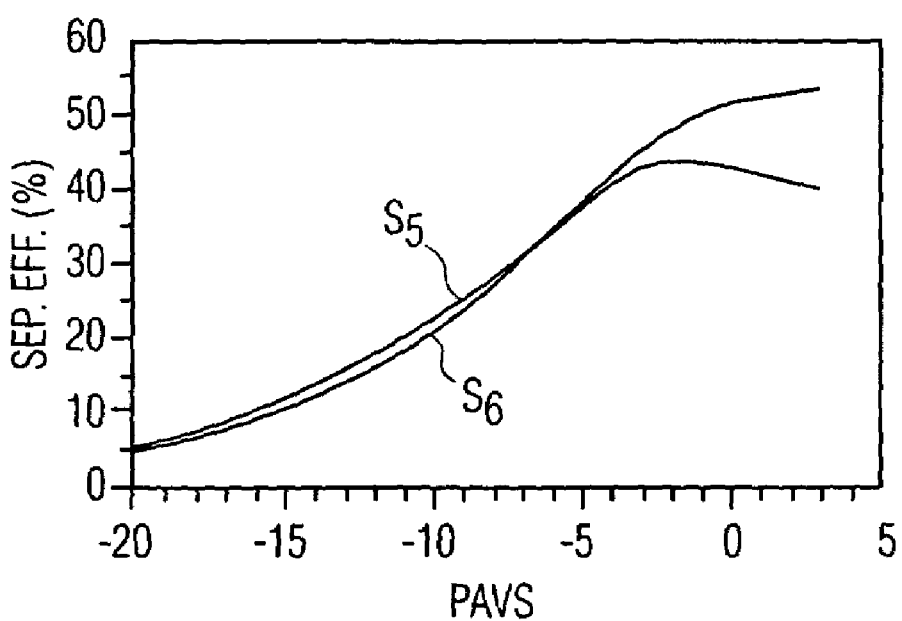
FIG. 16 shows performance of a preferred embodiment.

FIGS. 15 and 16 shows performance of a multiband, multistage power amplifier device embodiment for large signals. FIG. 15 shows output power for two signals $S_3$ and $S_4$ at 840 MHz and 1880 MHz (the central bandwidth frequencies of CDMA 800 and CDMA1900 respectively.) FIG. 16 shows power added efficiency for two signals $S_5$ and $S_6$ at 840 MHz and 1880 MHz (the central bandwidth frequencies of CDMA 800 and CDMA 1900 respectively.) As can be seen, similar output powers and power added efficiency (more than 45%) are provided by this embodiment.

Embodiments of the present invention may be used in dual and other multiband architectures. Examples of dual band architectures are GSM900/DCS1800 or CDMA800/CDMA1900. Examples of triple band architectures are GSM900/DCS 1800/PCS 1900 or CDMA800/CDMA 1900/PCS 1900.

Various types of system architectures may be utilized for constructing the embodiments of the present invention. One of ordinary skill in the art will accordingly appreciate that embodiments of the invention or various components and/or features thereof may be entirely comprised of hardware, software or may be a combination of software and hardware. While the invention has been described by illustrative embodiments, additional advantages and modifications will occur to those skilled in the art. Therefore, the invention in its broader aspects is not limited to specific details shown and described herein. Modifications may be made without departing from the spirit and scope of the invention. Accordingly, it is intended that the invention not be limited to the specific illustrative embodiments, but be interpreted within the full spirit and scope of the appended claims and their equivalents.

We claimed:

1. A method for amplification or attenuation comprising:
   providing an input signal;
   providing a converter for converting amplitude characteristics of said input signal into digital pulses, said digital pulses comprising control instructions;
   providing at least a first transistor and at least a second transistor for receiving digital pulses from the converter and for generating control signals according to said received digital pulses;
   providing at least a first non-linear current source and at least a second non-linear current source for receiving a portion of said input signal and at least one first control signal generated by the at least one first transistor and at least one second control signal generated by the second transistor;
   matching impedance of said first and second non-linear current sources, upon provision of said input signal thereto, through an input impedance matching circuit;
   combining any current generated by said first and second non-linear current sources, in order to generate an output signal comprising linear amplification of said input signal at certain desired times and attenuation of said input signal at certain other desired times.

2. The method of claim 1 wherein the input signal further comprises a phase characteristic of an input wave.

3. The method of claim 1 further comprising providing an output impedance matching circuit through which said output signal passes for simultaneously matching impedances at different frequencies of said input signal.

4. A method for amplification or attenuation comprising:
   providing an input signal of a first bandwidth;
   providing an input signal of a second bandwidth;
   providing an input impedance matching circuit;
   providing a first amplifying device;
   providing an interstage impedance matching circuit;
   providing a second amplifying device;
   wherein when said input signal of first bandwidth or said input signal of second bandwidth passes to said input impedance matching circuit, said input impedance matching circuit matches impedance with said first amplifying device, and when said input signal of first bandwidth or said input signal of second bandwidth passes to said second amplifying device, said interstage impedance matching circuit matches impedance with said second amplifying device; and
   wherein at least one of said first amplifying device and said second amplifying device comprises at least first and second current sources operatively connected so that any current generated by said first and second current sources comprises linear amplification or attenuation of at least one of said input signal of first bandwidth or said input signal of second bandwidth, said current sources generating current according to digital control instructions received from a converter and based on amplitude characteristics of said input signals.

5. The method in claim 4 further comprising matching impedance upon output from said second amplifying device, via an output impedance matching circuit.

6. The method of claim 4 wherein the input signal further comprises a phase characteristic of an input wave.

7. A method of amplification comprising:
   providing a plurality of amplifying devices, at least one of said plurality of amplifying devices comprising a plurality of current sources operatively connected so that any output signal generated by said plurality of current sources provides at least one of linear amplification or attenuation of an input signal;
   providing one or more interstage impedance matching circuits each positioned between two of the plurality of amplifying devices;
   providing an output impedance matching circuit through which a signal from a last of the plurality of amplifying devices passes, said output impedance matching circuit comprising a switching output impedance matching circuit; and
   providing a band diplexer for connection of the last of the plurality of amplifying devices to a load.

8. The method of claim 7 wherein at least one of said one or more interstage impedance matching circuits further comprises an RLC circuit.

9. The method of claim 7 wherein at least one of said at least one of the plurality of amplifying devices comprises at least one field effect transistor.

10. The method of claim 7 wherein at least one of said at least one of the plurality of amplifying devices comprises at least one bipolar transistor.

11. The method of claim 7 further comprising generating an output power.

12. The method of claim 7 further comprising generating an output power that is substantially the same for a plurality of operating frequencies.

13. The method of claim 7 further comprising simultaneously matching impedances at different frequencies of said input signal.

14. An apparatus for amplification or attenuation comprising:
   a converter for converting amplitude characteristics of an input signal into digital pulses, said digital pulses comprising control instructions;

at least a first transistor and at least a second transistor for receiving digital pulses from the converter and for generating control signals according to said received digital pulses;

at least a first non-linear current source and at least a second non-linear current source for receiving a portion of the input signal and at least one first control signal generated by the at least one first transistor and at least one second control signal generated by the second transistor;

an input impedance matching circuit for matching impedance of said first and second non-linear current sources, upon provision of said input signal thereto;

wherein any current generated by said first and second non-linear current sources, is combined in order to generate linear amplification of said input signal at certain desired times and attenuation of said input signal at certain other desired times.

15. The apparatus of claim 14 wherein the input signal further comprises a phase characteristic of an input wave.

16. The apparatus of claim 14 further comprising a band diplexer for connection of a last non-linear current source to a load.

17. An apparatus for amplification or attenuation comprising:

means for providing an input signal of a first bandwidth;
means for providing an input signal of a second bandwidth;
an input impedance matching circuit;
a first amplifying device;
an interstage impedance matching circuit;
a second amplifying device;
wherein, when said input signal of first bandwidth or said input signal of second bandwidth passes to said input impedance matching circuit, said input impedance matching circuit matches impedance with said first amplifying device, and when said input signal of first bandwidth or said input signal of second bandwidth passes to said second amplifying device, said interstage impedance matching circuit matches impedance with said second amplifying device; and
wherein at least one of said first amplifying device and said second amplifying device comprises at least first and second current sources operatively connected so that any current generated by said first and second current sources comprises linear amplification or attenuation of at least one of said input signal of first bandwidth or said input signal of second bandwidth, said current sources generating current according to digital control instructions received from a converter means and based on amplitude characteristics of said input signals.

18. The apparatus of claim 17 wherein impedances are matched upon output from said second amplifying device, via an output impedance matching circuit.

19. The apparatus of claim 17 wherein the input signal further comprises a phase characteristic of an input wave.

20. An apparatus for amplification or attenuation comprising:

a plurality of amplifying devices;
one or more interstage impedance matching circuits each positioned between two of the plurality of amplifying devices, at least one of said plurality of amplifying devices comprising a plurality of current sources operatively connected so that any output signal generated by said plurality of current sources provides at least one of linear amplification or attenuation of an input signal;
an output impedance matching circuit through which a signal from a last of the plurality of amplifying devices passes, said output impedance matching circuit comprising a switching output impedance matching circuit; and
a band diplexer for connection of the last of the plurality of amplifying devices to a load.

21. The apparatus of claim 20 wherein at least one of said one or more interstage impedance matching circuits further comprises an RLC circuit.

22. The apparatus of claim 20 wherein at least one of said at least one of the plurality of amplifying devices comprises at least one field effect transistor.

23. The apparatus of claim 20 wherein at least one of said at least one of the plurality of amplifying devices comprises at least one bipolar transistor.

24. The apparatus of claim 20 further comprising generating an output power via said last of the plurality of amplifying devices for input to said band diplexer.

25. The apparatus of claim 20 further comprising generating an output power via said last of the plurality of amplifying devices that is substantially the same for a plurality of operating frequencies for input to said band diplexer.

26. The apparatus of claim 20 wherein said one or more interstage impedance matching circuits each positioned between two of the plurality of amplifying devices; and said output impedance matching circuit simultaneously match impedances at different frequencies of said input signal.

27. An integrated circuit for electromagnetic processing comprising:

a plurality of amplifying devices for receiving a common input signal, at least one of said plurality of amplifying devices comprising a plurality of current sources operatively connected so that any output signal generated by said plurality of current sources comprises at least one of linear amplification or attenuation of an input signal; and
a plurality of control components for receiving digital control pulses generated from amplitude characteristics of said input signal and coupled to the respective inputs of the plurality of current sources, the plurality of control components being regulated by said digital control pulses for controlling said plurality of current sources; and
one or more interstage matching circuits each positioned between two of the plurality of amplifying devices.

28. The integrated circuit of claim 27, further comprising an output impedance matching circuit through which a signal from a last of the plurality of amplifying devices passes, with said output impedance matching circuit simultaneously matching impedances at different frequencies of said input signal.

29. The integrated circuit of claim 27, further comprising a band diplexer for connection of a last of said plurality of amplifying devices to a load.

* * * * *